United States Patent
Misdom et al.

(10) Patent No.: US 6,700,432 B2
(45) Date of Patent: Mar. 2, 2004

(54) TWO-TERMINAL SWITCH CIRCUIT AND VOLTAGE THRESHOLD RESPONSIVE CIRCUIT COMPONENT

(75) Inventors: Johannes A. C. Misdom, Eindhoven (NL); Johannes L. M. Verhees, Valkenswaard (NL); Jozef J. M. Hulshof, Waalre (NL); Frank J. P. Van Rens, Horst (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 54 days.

(21) Appl. No.: 09/923,608

(22) Filed: Aug. 7, 2001

(65) Prior Publication Data

US 2002/0043998 A1 Apr. 18, 2002

(30) Foreign Application Priority Data

Aug. 10, 2000 (GB) .............................................. 0019535

(51) Int. Cl.[7] .............................................. H03K 17/56
(52) U.S. Cl. ....................... 327/419; 327/205; 323/282; 361/78
(58) Field of Search ................................. 327/205, 206, 327/208, 419, 427, 438, 493, 440, 444, 465; 361/78, 86–88; 363/49, 50, 54; 323/311, 317, 265, 282

(56) References Cited

U.S. PATENT DOCUMENTS

| | | | | |
|---|---|---|---|---|
| 4,985,820 A | * | 1/1991 | Vorel | 363/49 |
| 5,041,940 A | * | 8/1991 | Sullivan | 361/18 |
| 5,081,379 A | | 1/1992 | Korteling | 327/50 |
| 5,444,595 A | * | 8/1995 | Ishikawa et al. | 361/86 |

FOREIGN PATENT DOCUMENTS

| | | |
|---|---|---|
| EP | 0139998 A1 | 5/1985 |
| FR | 2344177 A1 | 10/1977 |

* cited by examiner

*Primary Examiner*—Minh Nguyen
(74) *Attorney, Agent, or Firm*—Aaron Waxler (57) ABSTRACT

A two-terminal switch circuit (1) for periodically energizing a load (20) from a voltage supply includes a controllable switch (4) connected between the switch terminals (2,3), a resistance (8) and a capacitor (9) connected in series between the terminals (2,3), and a voltage threshold responsive arrangement (26) having a hysterisis characteristic. The voltage threshold responsive arrangement has a signal input (27) and a power supply input (29) connected to the common point (12) of the resistance and the capacitor, and a signal output (28) connected to a control input (13) of the controllable switch. The voltage threshold responsive arrangement is powered by the capacitor voltage. The threshold responsive arrangement closes the switch when the capacitor charges to a first threshold voltage and opens the switch when the capacitor thereafter discharges to a second threshold voltage which is lower than the first threshold voltage.

15 Claims, 6 Drawing Sheets

FIG. 6

TWO-TERMINAL SWITCH CIRCUIT AND VOLTAGE THRESHOLD RESPONSIVE CIRCUIT COMPONENT

BACKGROUND OF THE INVENTION

This invention relates to a two-terminal switch circuit for inclusion in series with a load across the terminals of a voltage supply for periodically energizing the load from the voltage supply. The invention also relates to a road vehicle direction indicator lamp circuit including such a switch circuit -and to a voltage threshold responsive circuit component for use in such a switch circuit.

Figure 1:
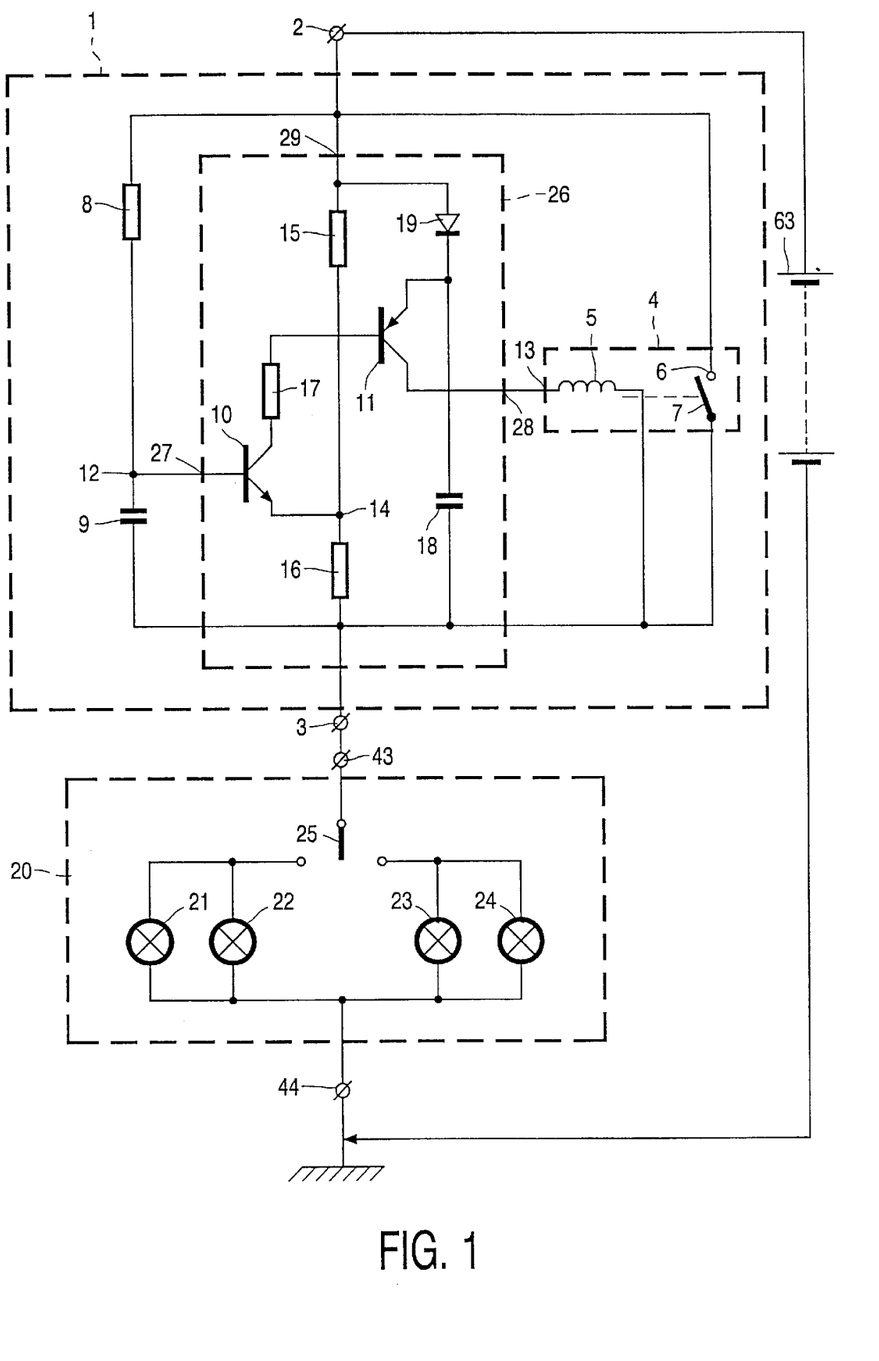
FIG. 1 shows the prior art switch circuit already described.

A two terminal switch circuit of this general kind, for controlling the flashing of the direction-indicating lamps of motor cars or other road vehicles, is shown in FIG. 2 of FR-A-2344177 and is reproduced as FIG. 1 of the accompanying diagrammatic drawings. The circuit comprises a controllable switch connected between said terminals, a resistance and a capacitor connected in series in that order between a given one of said terminals and the other one of said terminals, and a voltage threshold responsive arrangement having an output signal/input signal characteristic which exhibits hysteresis. The voltage threshold responsive arrangement couples the common point of the resistance and the capacitor to a control input of the controllable switch for, in operation, closing the switch in the event of the voltage across the capacitor increasing to above a first threshold value and opening the switch in the event of the voltage across the capacitor subsequently decreasing to below a second threshold value which is lower than the first threshold value. The voltage threshold responsive arrangement has a power supply input for receiving an energizing voltage relative to said other one of said terminals.

FIG. 1 of the accompanying drawings, shows this prior art switch circuit 1 of FR-A-2344177. It has two terminals 2 and 3 respectively and comprises a controllable switch 4 which is constructed as a relay having an energizing coil 5 and contacts 6,7 which are connected between the terminals 2 and 3. A resistor 8 and a capacitor 9 are connected in that order between a given one of the terminals 2 and 3 (terminal 2) and the other one of these terminals (terminal 3). The switch circuit 1 furthermore includes a voltage threshold responsive arrangement 26 having an output signal/input signal characteristic which exhibits hysteresis. Arrangement 26 has a signal input 27 connected to the common point 12 of the resistor 8 and the capacitor 9, a signal output 28 connected to a control input 13 of the relay 4, and a power supply input 29 connected to the terminal 2 for receiving an energizing voltage relative to the terminal 3. Control input 13 is connected to one end of the energizing coil 5 the other end of which is connected to the terminal 3.

The voltage threshold responsive arrangement 26 comprises an npn transistor 10, a pnp transistor 11, resistors 15, 16 and 17, a reservoir (storage) capacitor 18 and a diode 19. Its signal input 27 is connected to the base of the transistor 10. The emitter of transistor 10 is connected to the tap 14 of a voltage divider formed by the resistors 15 and 16, which are connected in series between the power supply input 29 and the terminal 3. The collector of transistor 10 is connected to the base of the transistor 11 via the resistor 17. The emitter of transistor 11 is connected to one electrode of the storage capacitor 18, the other electrode of which is connected to the terminal 3. The one electrode of the capacitor 18 is also connected to the power supply input 29 via the diode 19. The collector of transistor 11 is connected to the signal output 28.

The terminal 3 of switch circuit 1 is connected to ground via a switchable load 20. Load 20 has first and second terminals 43 and 44 respectively and comprises a pair of left indicator lamps 21 and 22 and a pair of right indicator lamps 23 and 24 of a road vehicle. The load 20 also includes a direction indicator switch 25 which is actuable into first, second and third states in which it connects the pair of lamps 21,22 between the terminals 43 and 44, the pair of lamps 23,24 between the terminals 43 and 44, and is open circuit respectively.

In operation a positive potential relative to ground is applied to terminal 2 by a voltage supply 63, for example, the battery of the vehicle. When switch 25 is open, i.e. is in its third state, neither of the two pairs of lamps 21,22 and 23,24 is energized, there is no voltage present between terminal 2 and terminal 3, and the relay contacts 6,7 are open because there is no voltage relative to terminal 3 on the relay control input 13. If switch 25 is now actuated into its first or second states to connect the pair of lamps 21,22 or the pair of lamps 23,24 to the terminal 3, the terminal 3 is then connected to ground through the relevant pair of lamps and therefore becomes negative relative to terminal 2. Storage capacitor 18 charges through diode 19 to the potential difference which is now present between terminals 2 and 3, and the emitter of transistor 10 is taken to a potential intermediate those on terminals 2 and 3 by means of the potential divider 15,16. Capacitor 9 starts to charge through resistor 8. When the voltage across capacitor 9 eventually increases to above a first threshold value equal to the voltage on the emitter of transistor 10 plus the base-emitter threshold voltage of transistor 10, transistor 10 conducts, turning on transistor 11 so that the collector of transistor 11 applies a positive voltage to the control input 13 of relay 4. The relay contacts 6,7 close, connecting terminal 2 to terminal 3 and thereby energizing the relevant pair of lamps 21,22 or 23,24. Although there is no longer any potential difference between terminals 2 and 3, transistors 10 and 11 continue to be supplied with operating current from the storage capacitor 18. Closure of the relay contacts 6,7 effectively connects the two potential divider resistors 15 and 16 in parallel so that the positive potential on the emitter of transistor 10 relative to terminal 3 is reduced, thereby increasing the forward base-emitter bias of transistor 10 and causing the relay contacts 6,7 to be held closed.

Capacitor 9 now starts to discharge through resistor 8 and the closed relay contacts 6,7. When the voltage on capacitor 9 eventually decreases to below a second, lower, threshold value equal to the reduced emitter voltage of transistor 10 plus the base-emitter threshold voltage of transistor 10 transistor 10 turns off, turning off transistor 11 and thereby removing the positive voltage from the control input 13 of relay 4. The relay contacts 6,7 open so that the lamps of the relevant pair 21,22 or 23,24 are extinguished. The opening of the contacts 6,7 also removes the parallel connection of the potential divider resistors 15 and 16 so that the emitter voltage of transistor 10 increases relative to terminal 3, thereby reducing the base-emitter voltage of transistor 10 still further and causing the ralay contacts 6,7 to be held open. Capacitor 9 now starts to change again through resistor 8 and the cycle repeats.

A disadvantage of the known switch circuit is that it is necessary to provide, in addition to a timing capacitor 9, a storage capacitor 18 to supply operating current to the transistors 10 and 11 at times when the relay contacts 6,7 are closed.

SUMMARY OF THE INVENTION

It is an object of the invention to provide a simplification in this respect.

According to a first aspect of the invention there is provided a two-terminal switch circuit for inclusion in series with a load across a voltage supply for periodically energizing the load from the supply comprises a controllable switch connected between said terminals, a resistance and a capacitor connected in series in that order between a given one of said terminals and the other one of said terminals, and a voltage threshold responsive arrangement the output signal/input signal characteristic of which exhibits hysteresis, said voltage threshold responsive arrangement coupling the common point of the resistance and the capacitor to a control input of the controllable switch for, in operation, closing the switch in the event of the voltage across the capacitor increasing to above a first threshold value and opening the switch in the event of the voltage across the capacitor subsequently decreasing to below a second threshold value which is lower than the first threshold value, said voltage threshold responsive arrangement having a power supply input for receiving an energizing voltage relative to said other one of said terminals. In accordance with the present invention such a circuit is characterized in that said power supply input is connected to said common point.

It has now been recognized that the voltage threshold responsive circuit can be constructed so as to allow it to be powered from across the capacitor, thereby making it unnecessary to provide a separate storage capacitor.

The controllable switch is preferably a transistor switch, preferably a Metal-Oxide-Semiconductor (MOSFET) switch. Transistor switches in general require lower control currents than, for example, relays. As these control currents have to be supplied from the capacitor, implementing the controllable switch as a transistor switch, preferably a MOSFET switch, can allow a lower value to be chosen for the capacitor than would be required if, for example, the controllable switch were implemented as a relay.

The voltage threshold responsive arrangement may, for example, comprise a resistive voltage divider connected across said capacitor and a thyristor structure having a control input connected to a tap on said resistive voltage divider, an output connected to the control input of the controllable switch and a common point which is connected to said power supply input.

As an alternative the voltage threshold responsive arrangement may comprise first and second resistive voltage dividers connected across said capacitor, and a set-reset flip-flop having a power supply input connected to the common point of the resistance and the capacitor, a set input connected to a tap on the first voltage divider, a reset input connected to a tap on the second voltage divider and an output connected to the control input of the controllable switch.

As another alternative the voltage threshold responsive arrangement may comprise an operational amplifier having a power supply input connected to the common point of the resistance and the capacitor, a non-inverting input connected to the common point of the resistance and the capacitor via a resistance, an inverting input connected to a reference voltage source, an output connected to the control input of the controllable switch, and a resistance connecting its output to its non-inverting input.

The resistance which is connected in series with the capacitor may be constituted by a constant current source. Constituting the resistance in this way can render the frequency at which the load is energized in operation substantially independent of the terminal voltage of the voltage supply.

As an alternative the resistance which is connected in series with the capacitor may be constituted by a controllable current source and the switch circuit may include a current sensing arrangement for sensing the magnitude of the current which flows through the controllable switch when the controllable switch is closed, the current sensing arrangement having an output coupled to a control input of the controllable current source for controlling the output current of the controllable current source in such manner that this output current increases with a decrease in the magnitude of the sensed current. Such a construction can result in the frequency with which the load is energized in operation varying inversely with the resistance of the load, which can be advantageous if, for example, the load comprises a plurality of road vehicle direction indicator lamps connected in parallel with each other. Such a construction may be implemented, for example, by employing a MOSFET structure as the controllable switch, this MOSFET structure having an additional source region which is connected to said other one of said terminals via a resistance, said additional source region being coupled to the control input of the controllable current source via a sample-and-hold circuit.

The invention also provides a road vehicle direction indicator lamp circuit including a two-terminal switch circuit according to the first aspect connected in series with a load across a battery included in the vehicle, the load having first and second terminals and comprising a pair of left indicator lamps, a pair of right indicator lamps and a direction indicator switch which is actuable into first, second and third states in which it connects the pair of left indicator lamps between the first and second terminals of the load, the pair of right indicator lamps between the first and second terminals of the load, and is open circuit respectively.

The invention also provides a voltage threshold responsive circuit component for use in a two-terminal switch circuit according to the first aspect in which the controllable switch is a transistor switch, said component having a first terminal for use as said given one of said terminals, a second terminal for use as said other one of said terminals and for connection to one electrode of the capacitor, and a third terminal for connection to the other electrode of the capacitor, the component comprising said resistance connected between the first and third terminals of the component, said transistor switch having its main current path connected between the first terminal of the component and the second terminal of the component, and said voltage threshold responsive circuit coupling the third terminal of the component to the control electrode of said transistor switch, said voltage threshold responsive arrangement having its power supply input connected to the third terminal of the component.

BRIEF DESCRIPTION OF THE DRAWINGS

Embodiments of the invention will now be described, by way of example, with reference to the accompanying diagrammatic drawings in which.

DESCRIPTION OF THE PREFERRED EMBODIMENTS

Figure 2:
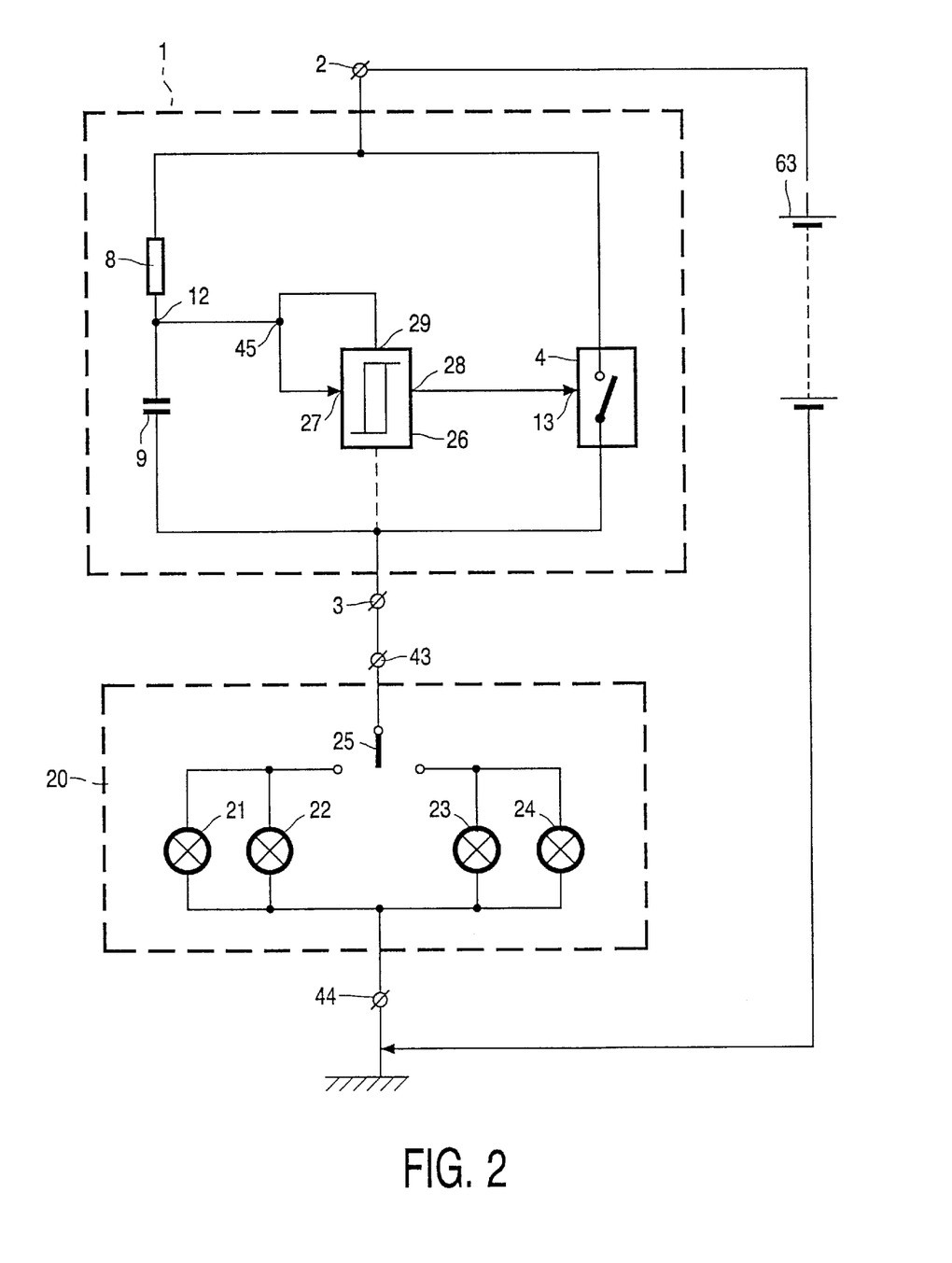
FIG. 2 is a simplified diagram of an embodiment of the invention connected, similarly to the circuit of FIG. 1, to control the flashing of the direction-indicating lights of a motor car or similar vehicle.

The embodiment of the invention shown in FIG. 2 comprises, similarly to the prior art circuit of FIG. 1, a switch circuit 1 which has two terminals 2 and 3 and which includes a controllable switch 4 connected between the terminals 2 and 3. A resistance 8 and a capacitor 9 are again connected in that order between a given one of the terminals 2 and 3 (terminal 2) and the other one of these terminals (terminal 3). Again the switch circuit 1 furthermore includes a voltage threshold responsive arrangement 26 having an output signal/input signal characteristic which exhibits hysteresis. Arrangement 26 again has a signal input 27 connected to the common point 12 of the resistor 8 and the capacitor 9, a signal output 28 connected to a control input 13 of the switch 4, and a power supply input 29 for receiving an energizing voltage relative to the terminal 3. However, in contradistinction to the prior art circuit shown in FIG. 1, in the embodiment of the invention shown in FIG. 2, the power supply input 29 is connected to the common point 12 rather than to the terminal 2. The signal input 27 and the power supply input 29 are effectively combined to form a single input 45.

Similarly to the prior art circuit of FIG. 1 the terminal 3 of the switch circuit 1 of FIG. 2 is connected to ground via a switchable load 20. Load 20 again has first and second terminals 43 and 44 respectively and comprises a pair of left indicator lamps 21 and 22 and a pair of right indicator lamps 23 and 24 of a road vehicle. The load 20 again also includes a direction indicator switch 25 which is actuable into first, second and third states in which it connects the pair of lamps 21,22 between the terminals 43 and 44, the pair of lamps 23,24 between the terminals 43 and 44, and is open circuit respectively.

In operation a positive potential relative to ground is applied to terminal 2 by a voltage supply 63, for example the battery of the vehicle. When switch 25 is open, i.e. is in its third state, neither of the two pairs of lamps 21,22 and 23,24 is energized, there is no voltage present between terminal 2 and terminal 3, and the controllable switch 4, which may be a power transistor switch, for example an n-channel enhancement-type power MOSFET with its source connected to terminal 3, its drain connected to terminal 2 and its gate constituting the control input 13, is open because there is no voltage relative to terminal 3 on its control input 13. If switch 25 is now actuated into its first or second state to connect either the pair of lamps 21,22 or the pair of lamps 23,24 to the terminal 3 terminal 3 becomes connected to ground through the relevant pair of lamps and therefore becomes negative relative to terminal 2. Capacitor 9 starts to charge through resistance 8 and thereby to apply an increasing energizing voltage, relative to the terminal 3, to the power supply terminal 29 of threshold responsive arrangement 26 and moreover to apply the same voltage to the signal input 27 of threshold responsive arrangement 26. When the voltage across capacitor 9 eventually increases to above a first threshold value determined by the construction of the threshold responsive arrangement 26 the arrangement 26 triggers so that it supplies a positive voltage to the control input 13 of switch 4. Switch 4 closes, connecting terminal 2 to terminal 3 and thereby energizing the relevant pair of lamps 21,22 or 23,24. Although there is no longer any potential difference between terminals 2 and 3 the threshold responsive arrangement 26 continues to be supplied with an energizing voltage from the capacitor 9. Moreover, because of the hysteresis exhibited by the arrangement 26 switch 4 remains closed even though capacitor 9 now starts to discharge inter alia through resistance 8 and the closed switch 4.

When the voltage on capacitor 9 eventually decreases to below a second, lower, threshold value determined by the construction of the threshold responsive arrangement 26 arrangement 26 triggers to its other output state, thereby removing the positive voltage from the control input 13 of switch 4. Switch 4 opens so that the lamps of the relevant pair 21,22 or 23,24 are extinguished. Capacitor 9 then starts to charge again through resistance 8 and the cycle repeats.

Figure 3:
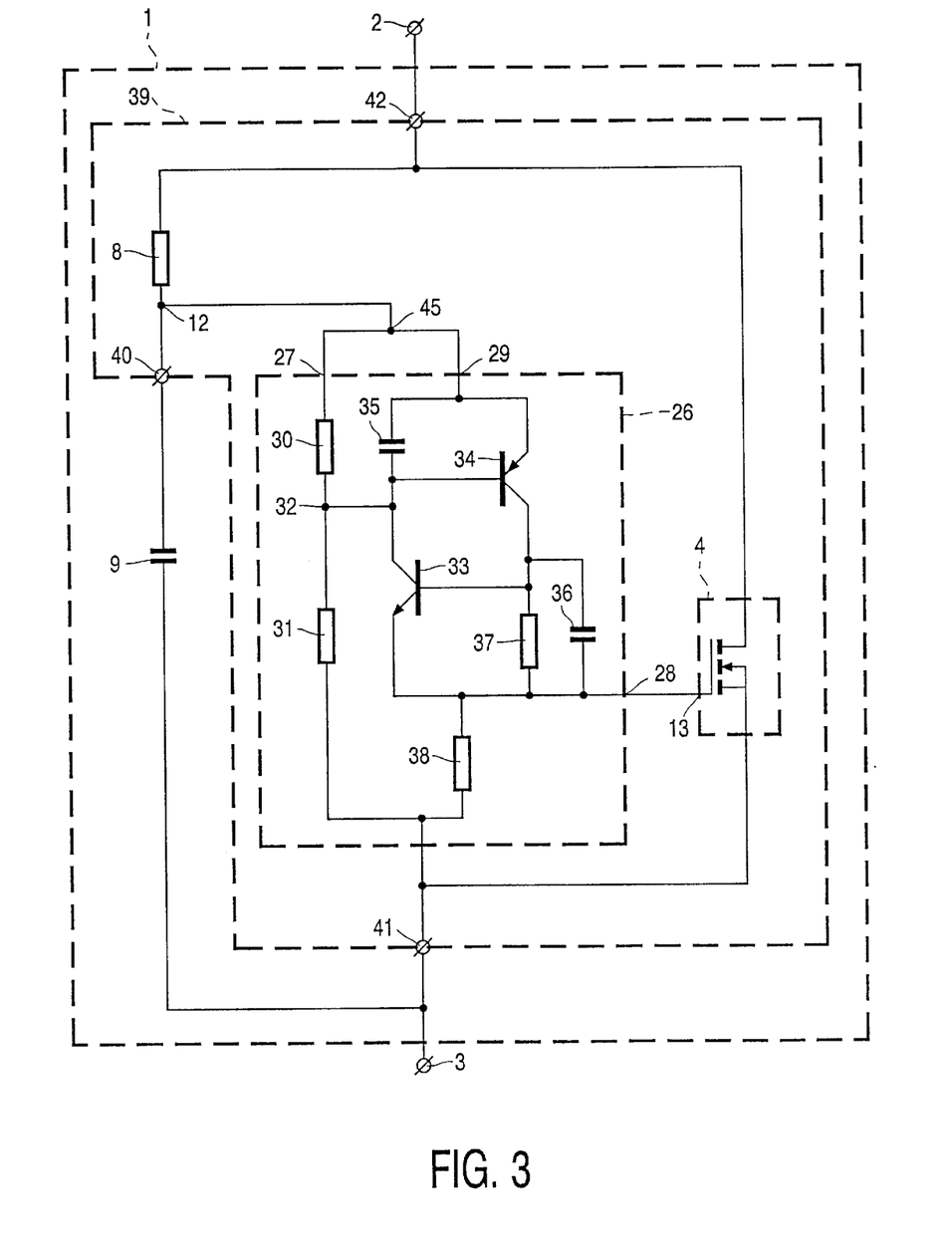
FIG. 3 is the circuit diagram of a first practical construction for the embodiment of FIG. 2.

FIG. 3 shows a first practical construction for the switch circuit 1 of FIG. 2 in detail, in particular for the voltage threshold responsive arrangement 26 included therein. The voltage threshold responsive arrangement 26 shown in FIG. 3 includes a thyristor structure comprising an npn transistor 33 and a pnp transistor 34 having its base connected to the collector of transistor 33 and its collector connected to the base of transistor 33. Transistors 33 and 34 may be formed by a unitary pnpn semiconductor structure in known manner. A capacitance 35 is included in parallel with the base-emitter path of the transistor 34 and both a capacitance 36 and a resistance 37 are included in parallel with the base-emitter path of transistor 33. The emitter of the transistor 33, which constitutes the output of the thyristor structure, is connected to the terminal 3 via a resistance 38 and also to the signal output 28 of the arrangement 26. The base of the transistor 34, which constitutes the control input of the thyristor structure, is connected to a tap 32 on a resistive voltage divider comprising resistances 30 and 31 connected in series between the signal input 27 of the arrangement 26 and the terminal 3. The emitter of transistor 34, which constitutes the common point of the control signal and output signal paths through the thyristor structure, is connected to the power supply input 29 of the arrangement 26. In FIG. 3 the switch 4 is constituted by an enhancement-type n-channel MOSFET, the gate of which constitutes the control input 13, the source of which is connected to the terminal 3 and the drain of which s connected to the terminal 2.

When a positive potential is applied to the terminal 2 of FIG. 3 relative to terminal 3, e.g. by actuation of the switch 25 of FIG. 2 into either its first or its second state, the capacitor 9 of FIG. 3 starts to charge through the resistor 8 and thereby apply an increasing positive energizing voltage relative to terminal 3 to the power supply input 29 of arrangement 26. Moreover, due to the action of the potential divider 30, 31 (which is connected across capacitor 9) an increasing negative potential is simultaneously applied to the base of the transistor 34 relative to its emitter. When this potential reaches the base- emitter threshold voltage of transistor 34 this transistor turns on, forward biasing the base-emitter junction of transistor 33. The resulting cumulative thyristor action around the transistors 33 and 34 results in these transistors being fully turned on, effectively connecting the signal output 28 and hence the gate of the power MOSFET 4 to the power supply input 29 and hence to the upper electrode of capacitor 9. A forward voltage is therefore applied to the gate of MOSFET 4 relative to its source and the MOSFET turns on, connecting terminal 2 to terminal 3.

Capacitor 9 then starts to discharge through resistance 8, the voltage divider 30,31 and the resistance 38 but the thyristor structure 33,34 continues to conduct due to the hysteresis inherently exhibited by such a structure. When the voltage across the capacitor 9 eventually falls so far that the current through resistance 30 and/or resistance 37 is insufficient to maintain the thyristor action the thyristor structure 33,34 abruptly turns off, removing the connection of the gate of MOSFET 4 to the power supply input 29. MOSFET 4 therefore also turns off, removing the connection between the terminals 2 and 3. Capacitor 9 then starts to charge again through resistance 8 and the cycle repeats.

In one implementation of the switch circuit 1 of FIG. 3 the transistors 4, 33 and 34 were those available under the type numbers BUK555, BC548 and BC558 respectively. The various other components had the following values.

| | |
|---|---|
| Capacitor 9 | 150 µF |
| Capacitors 35 and 36 | 1nF |
| Resistor 8 | 3k9Ω |
| Resistors 30 and 37 | 1k5Ω |
| Resistor 31 | 18kΩ |
| Resistor 38 | 4k7Ω |

Obviously the polarity of the voltage applied between terminals 2 and 3 of FIG. 3, which voltage may, for example, have a nominal magnitude of 12 volts, may be reversed if desired, provided that each of the transistors 33 and 34 is replaced by a transistor of the opposite conductivity type and the n-channel MOSFET which constitutes the switch 4 is replaced by a p-channel MOSFET.

The MOSFET employed as the switch 4 of FIG. 3 may be replaced by another form of controllable switch if desired, for example a relay as shown in FIG. 1 or a bipolar transistor. (If a bipolar transistor or a relay is employed the resistance 38 may be omifted.) However a MOSFET is preferred due to the relatively low control current which it requires, which control current has to be supplied from the capacitor 9.

Figure 4:
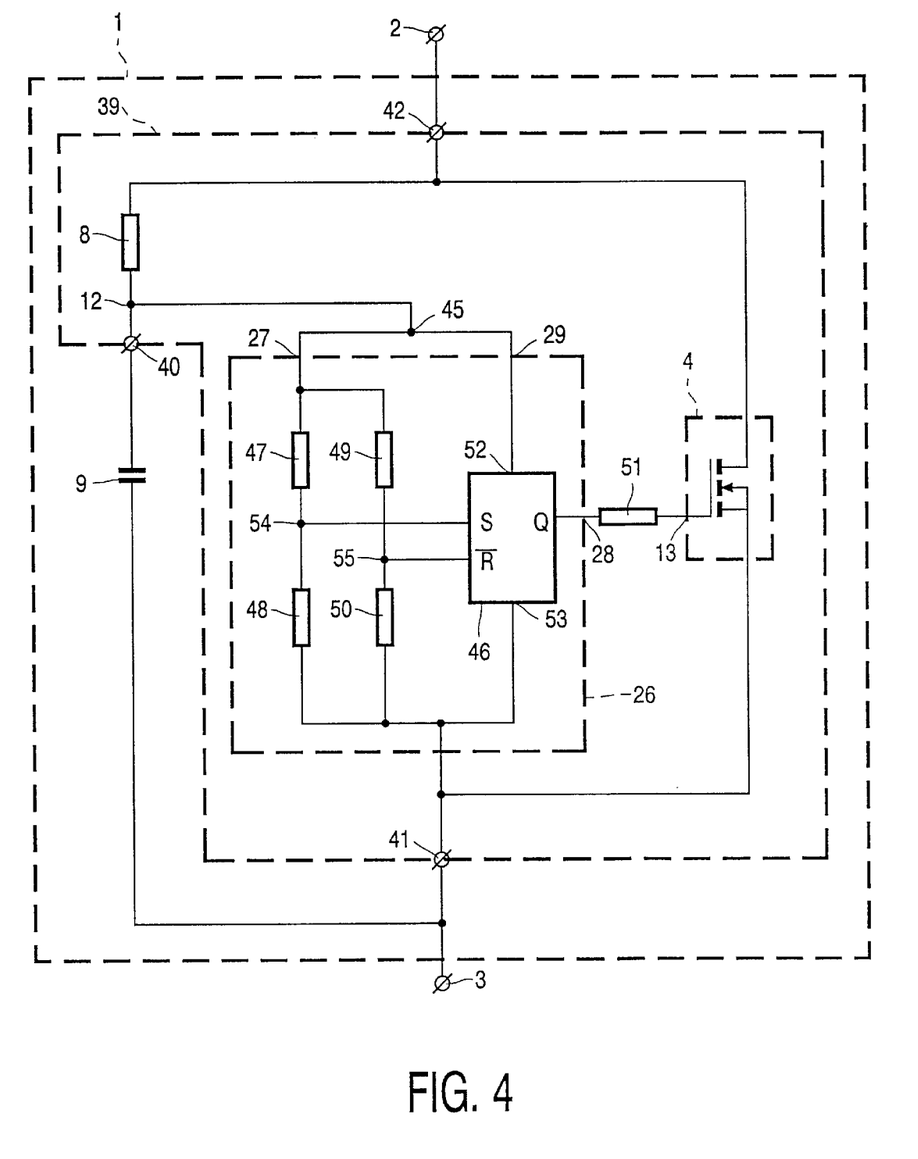
FIG. 4 is the circuit diagram of a second practical construction for the embodiment of FIG. 2.

FIG. 4 shows a second practical construction for the switch circuit 1 of FIG. 2. The switch circuit 1 of FIG. 4 differs from that of FIG. 3 in that the voltage threshold responsive arrangement 26 now comprises a set-reset flip-flop 46, and four resistances 47, 48, 49 and 50 respectively. The flip-flop 46 has a set input S, an inverting reset input $\overline{R}$ and an output Q, and is constructed to be edge-triggered, i.e. so that it is triggered into its set state in the event of the voltage at its set input S rising to above a given threshold value and is triggered into its reset state in the event of the voltage at its inverting reset input $\overline{R}$ subsequently falling to below the given threshold value, the reset overriding the set function. Moreover the construction of the flip-flop 46 is such that its initial state on being energized is always its reset state.

The output Q of flip-flop 46 is connected to the output 28 of the arrangement 26 which is in turn connected to the control input 13 of the switch 4 via a current-limiting resistance 51. The Vcc input 52 of flip-flop 46 is connected to the power supply input 29 of the arrangement 26 and the Vdd input 53 of flip-flop 46 is connected to the terminal 3. The resistances 47 and 48 are connected in series between the signal input 27 of the arrangement 26 and the terminal 3 and constitute a resistive voltage divider having a tap 54. Similarly, the resistances 49 and 50 are connected in series between the signal input 27 of the arrangement 26 and the terminal 3 and constitute a resistive voltage divider having a tap 55. The taps 54 and 55 are connected to the set S and inverting reset $\overline{R}$ inputs respectively of the flip-flop 46. The ratio of the resistance 47 to the resistance 48 is chosen to be greater than the ratio of the resistance 49 to the resistance 50 so that the magnitude of the voltage (if any) on tap 54 relative to terminal 3 is always less than the magnitude of the voltage (if any) on tap 55 relative to terminal 3.

When a positive potential is applied to the terminal 2 of FIG. 4 relative to terminal 3, e.g. by actuation of the switch 25 of FIG. 2 into either its first or its second state, flip-flop 46 is in its reset state and MOSFET switch 4 is open. The capacitor 9 of FIG. 4 starts to charge through the resistance 8 and thereby apply an increasing positive energizing voltage, relative to terminal 3, to the power supply input 29 of arrangement 26 and hence to the Vcc input of flip-flop 46, and also apply the same increasing voltage to the signal input 27 of the arrangement 26. When the voltage across capacitor 9 eventually increases to above a first threshold value determined by the relative values of resistances 47 and 48 the flip-flop 46 is set via its set input S, closing switch 4. Capacitor 9 then discharges through resistance 8 and the switch 4. When the voltage across capacitor 9 eventually falls to below a second, lower, threshold value determined by the relative values of resistances 49 and 50 the flip-flop 46 is reset via its inverting reset input $\overline{R}$, opening switch 4. The cycle then repeats.

With a nominal 12 volts applied between the terminals 2 and 3 the ratio between resistances 47 and 48 and the ratio between resistances 49 and 50 may conveniently be chosen so that the first threshold voltage (producing the aforesaid given threshold voltage on set input S) is approximately 10 volts and the second threshold voltage (producing the aforesaid given threshold voltage on inverting reset input $\overline{R}$) is approximately 5 volts. It will be appreciated that a voltage swing between these values across capacitor 9 and hence across the Vcc and Vdd inputs of flip-flop 46 imposes requirements on the power supply rejection properties of flip-flop 46, which should be constructed accordingly.

Preferably the set and reset inputs of flip-flop 46 are Schmitt trigger inputs.

Figure 5:
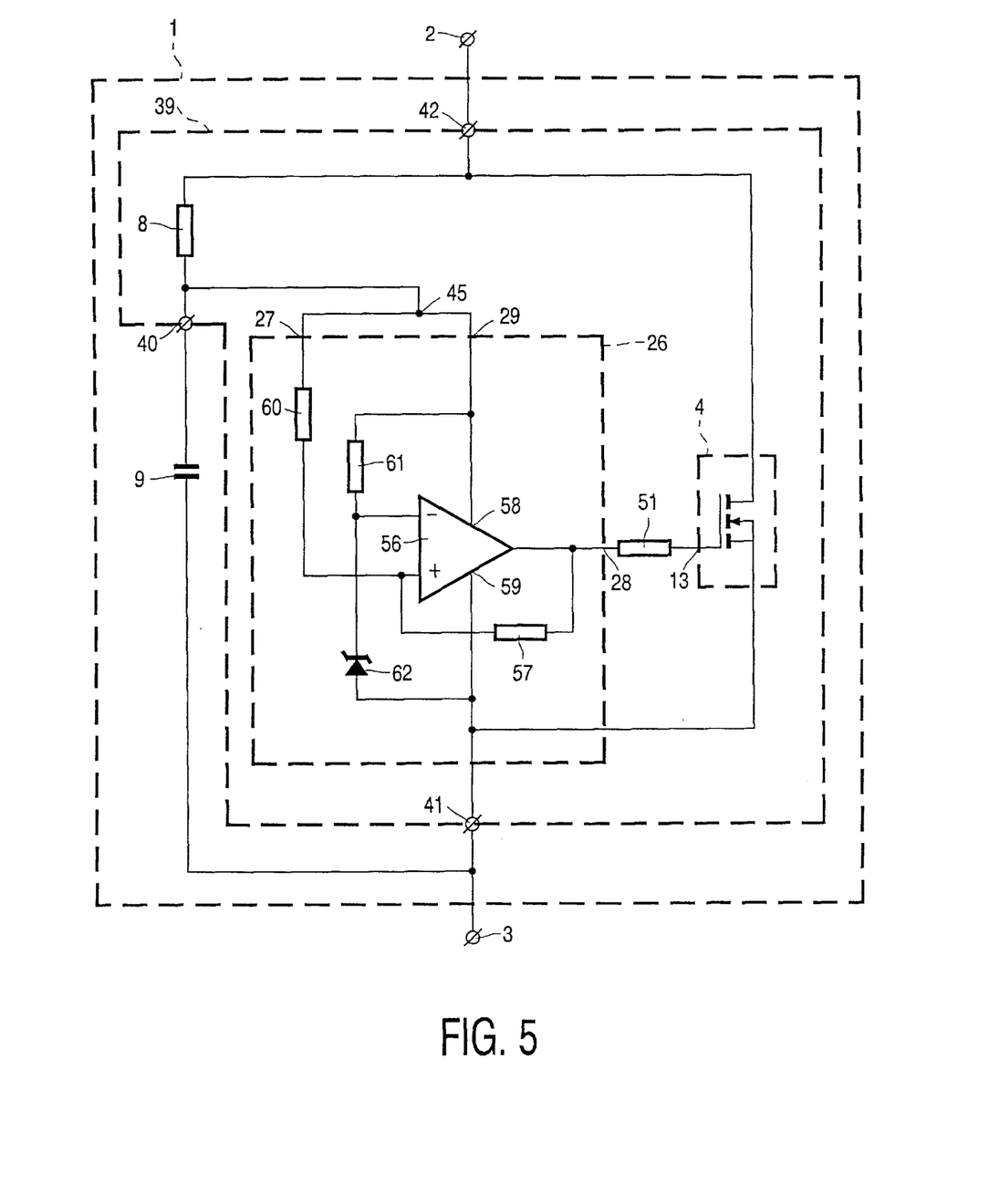
FIG. 5 is the circuit diagram of a third practical construction for the embodiment of FIG. 2.

FIG. 5 shows a third practical construction for the switch circuit 1 of FIG. 2. The switch circuit 1 of FIG. 5 differs from that of FIGS. 3 and 4 in that the voltage threshold responsive arrangement 26 now comprises an operational amplifier 56 having a resistance 57 connected between its output and its non-inverting input to provide positive feedback. The output of amplifier 56 is also connected to the output 28 of the arrangement 26. The Vcc input 58 of amplifier 56 is connected to the power supply input 29 of the arrangement 26 and the Vdd input 59 of amplifier 56 is connected to the terminal 3. The signal input 27 of the arrangement 26 is connected to the non-inverting input of amplifier 56 via a resistance 60 which may have a value of, for example, one tenth of that of resistance 57. The inverting input of amplifier 56 is connected to the power supply input 29 of the arrangement 26 via a resistance 61, and to the terminal 3 via a Zener diode 62. Resistance 61 and Zener diode 62 together form a reference voltage source. With a nominal 12 volts applied between the terminals 2 and 3 the breakdown voltage of the Zener diode 62 may be chosen to be, for example, 6 volts.

The circuit configuration comprising amplifier 56 and resistances 57 and 60 operates in known manner as a voltage comparison circuit with hysteresis. Its output adopts a "high" state, closing MOSFET switch 4, when the voltage on signal input 27 increases to above a first threshold value determined by the breakdown voltage of Zener diode 62 and the ratio between the resistances 57 and 60, and adopts a "low" state, opening MOSFET switch 4, when the voltage on signal input 27 subsequently decreases to below a second, lower, threshold value also determined by the breakdown voltage of Zener diode and the ratio between the resistors 57 and 60.

When a positive potential is applied to the terminal 2 of FIG. 5 relative to terminal 3, e.g. by actuation of the switch 25 of FIG. 2 into either its first or its second state, the MOSFET switch 4 of FIG. 5 is initially open, there being zero potential on its gate relative to terminal 3. The capacitor 9 of FIG. 5 starts to charge through the resistance 8 and thereby apply an increasing positive energizing voltage, relative to terminal 3, to the power supply input 29 of arrangement 26 and hence to the Vcc input of amplifier 56, and also apply the same increasing voltage to the signal input 27 of the arrangement 26. The voltages on the inverting and non-inverting inputs of amplifier 56 are initially both equal to the voltage on capacitor 9, so that the output voltage of amplifier 56 tends towards a value lying between this voltage and the voltage on terminal 3. This causes the positive feedback through resistance 57 to drive the voltage on the non-inverting input of amplifier 56 to below that on its inverting input, so that the output voltage of amplifier 56 is driven down to the potential on terminal 3. This situation continues until the voltage across capacitor 9 eventually increases to above a value (the first threshold value) at which the voltage on the non-inverting input of amplifier 56 becomes equal to the breakdown voltage of Zener diode 62. This results in the output voltage of amplifier 56 becoming positive relative to terminal 3, the transition being reinforced by the positive feedback through resistance 57. MOSFET switch 4 therefore closes. Capacitor 9 then starts to discharge through resistance 8 and the switch 4. When the voltage across capacitor 9 eventually falls to below a value (the second threshold value) at which the voltage on the non-inverting input of amplifier 56 again becomes equal to the breakdown voltage of Zener diode 62 (this value being lower than the first threshold value because the output voltage of amplifier 56 is now positive) the output voltage of amplifier 56 falls, and the positive feedback through resistance 57 reinforces this. The output voltage of amplifier 56 is therefore driven down to the potential on terminal 3, opening switch 4. The cycle then repeats.

It will be appreciated that the switching frequency of the two-terminal switch circuits 1 so far described with reference to FIGS. 2–5 of the drawings will, when the resistance 8 is constituted by a discrete resistor, be dependent upon the terminal voltage of the voltage supply 63 of FIG. 2 and also by the resistance of the load 20 which is switched. In order to make the switching frequency substantially independent of this terminal voltage and resistance the resistance 8 may be formed by a constant current source, for example by a two-terminal circuit, known per se, comprising a Junction Field Effect Transistor (JFET) having its drain connected to one of the terminals of this circuit and its gate and source connected to the other of the terminals of this circuit, the source via a series resistor.

As just mentioned, the switching frequency of the two-terminal switch circuits 1 so far described with reference to FIGS. 2–5 of the drawings will, when the resistance 8 is constituted by a discrete resistor, be dependent upon the resistance of the load 20, e.g. the resistance of the direction-indicating lamp configuration 20 shown in FIG. 2 when the switch 25 is actuated into its first or second state to connect either the pair of lamps 21,22 or the pair of lamps 23,24 to the terminal 3. However, the resistance of the direction-indicating lamp configuration 20 shown in FIG. 2 when the switch 25 is actuated into its first or second state is likely to be much less than that of the resistor 8, with the result that this dependence is likely to be only small. Moreover, the frequency will decrease with increasing resistance of this configuration.

Figure 6:
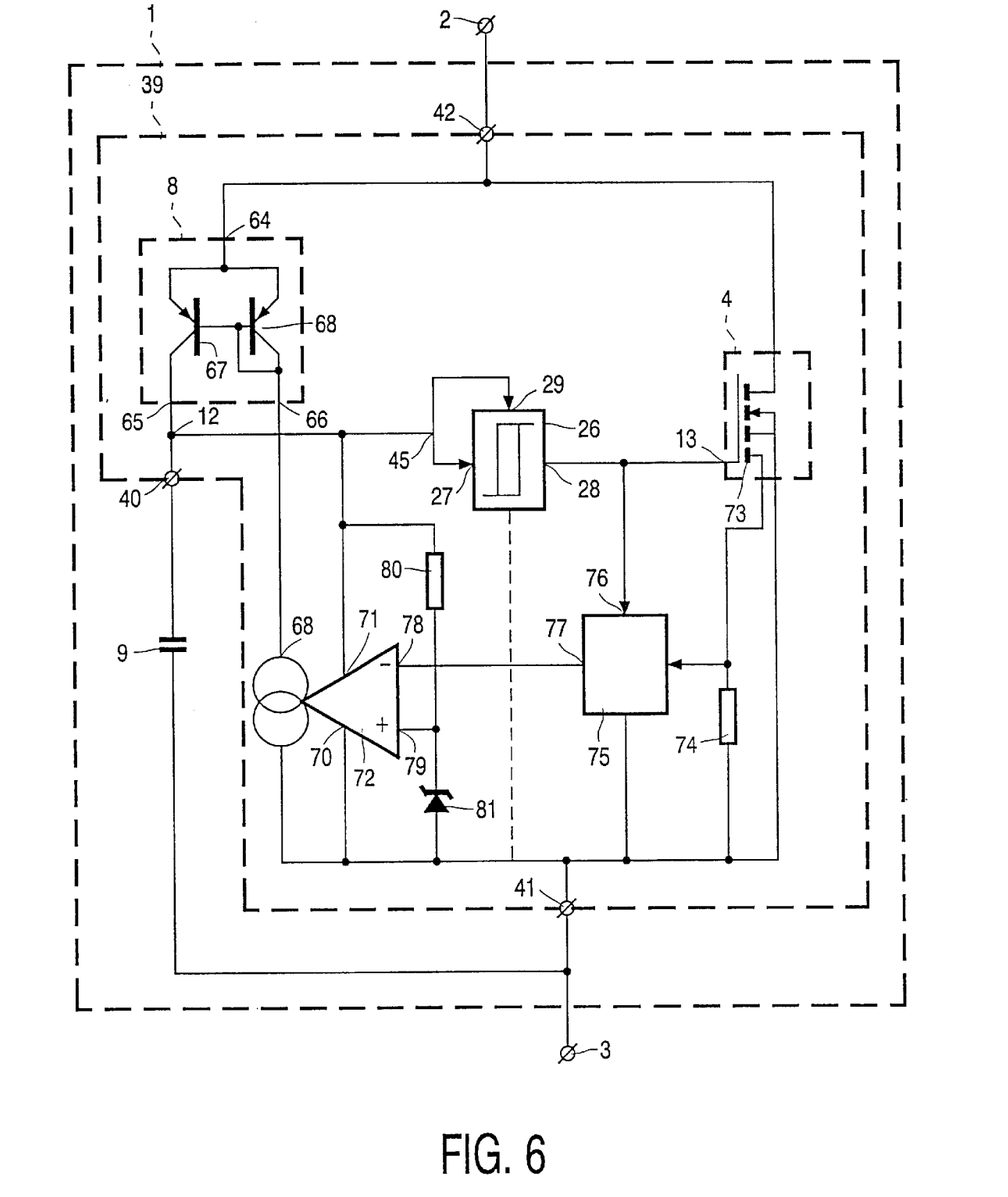
FIG. 6 is the circuit diagram of an elaboration of the embodiment of FIG. 2, Corresponding items have been given the same reference numerals in the various Figures.

At least in some countries legislation requires that the flashing frequency of road vehicle direction-indicating lamps increases noticeably in the event of failure of one of the lamps of an energized pair, to indicate that such failure has occurred. Such a frequency increase can be arranged to occur with the switch circuits 1 of FIGS. 2–5 by forming the resistance 8 as a controllable current source, sensing the current flowing through switch 4 when switch 4 is closed, and controlling the output current of the current source in such manner that this output current increases with a decrease in the sensed current. FIG. 6 of the drawings shows an example of how the switch circuit 1 of FIG. 2 can be elaborated to achieve this result.

As shown in FIG. 6, the resistance 8 of FIG. 2 is constituted by a controllable current source having output terminals 64 and 65 and a control signal input terminal 66. The source 8 takes the form of a current mirror comprising a pair of pnp transistor structures 67 and 68 having commoned emitters connected to the terminal 64 and commoned bases connected to the terminal 66. The collector of structure 67 is connected to the terminal 65 and the collector of structure 68 is connected to the terminal 66. The control signal input terminal 66 of source 8 is fed from the output 69 of an operational transconductance amplifier 70. The Vcc input 71 of amplifier 70 is connected to the common point 12 of resistance 8 and capacitor 9, and the Vdd input 71 of amplifier 70 is connected to the terminal 3, so that amplifier 70 is powered from across the capacitor 9 in operation.

Similarly to the constructions shown in FIGS. 3–5, in FIG. 6 the switch 4 is constituted by an enhancement-type n-channel MOSFET the gate of which constitutes the control input 13, the source of which is connected to the terminal 3 and the drain of which is connected to the terminal 2. However, in FIG. 6 the MOSFET is provided with an additional separate source region 73 as disclosed, for example, in EP-A-0139998 which is incorporated herein by reference. Region 73 is connected to the terminal 3 via a resistance 74, the items 73 and 74 together forming a current sensing arrangement. As disclosed in EP-A-0139998, in operation the current through the additional source region 73 emulates the current through the main source region of the MOSFET. Therefore when the MOSFET switch 4 is closed the magnitude of the voltage, relative to terminal 3, on the additional source region 73 is proportional to the current through the switch. Each time the MOSFET switch 4 is closed this voltage is sampled by a sample-and-hold circuit 75 having a sampling signal input 76 fed from the output 28 of the voltage threshold responsive arrangement 26. The output 77 of circuit 75 is connected to the inverting input 78 of the transconductance amplifier 70. The non-inverting input 79 of amplifier 70 is connected to the common point 12 of resistance 8 and capacitor 9 via a resistance 80, and to terminal 3 via a Zener diode 81, so that input 79 is fed with a reference voltage equal to the breakdown voltage of diode 81 in operation. Therefore the current at the output 65 of current source 8 when switch 4 is open, and hence the switching frequency of switch circuit 1, increases with decreasing voltage on the additional source region 73 when switch 4 is closed, i.e. with increasing resistance of the load 20 of FIG. 2.

The MOSFET switch 4 of FIG. 6 together with its additional source region 73 and the resistance 74 may be replaced, for example, by a power semiconductor arrangement and current sensing circuit as described and claimed in U.S. Pat. No. 5,081,379 which is incorporated herein by reference.

The constructions shown in FIGS. 3 to 5 for the threshold responsive arrangement 26 of FIG. 2 may, of course, also be used for the threshold responsive arrangement 26 of FIG. 6.

If desired the part of the switch circuit 1 of each of FIGS. 3 to 6 which is shown enclosed by a dashed line 39 may be constructed as a unitary circuit component having a terminal 40 for connection to one electrode of capacitor 9, a terminal 41 for connection to the other electrode of capacitor 9 and use as the terminal 3, and a terminal 42 for use as the terminal 2. The constituents of such a component may be included in a common three-terminal package.

From reading the above description and studying the accompanying drawings, other modifications and variations will be apparent to persons skilled in the art. Such modifications and variations may involve other features which are already known in the art and which may be used instead of or in addition to features already disclosed herein. Although claims have been formulated in this application to particular combinations of features, it should be understood that the scope of the disclosure of the present application includes any and every novel feature or combination of features disclosed herein either explicitly or implicitly and together with all such modifications and variations, whether or not relating to the main inventive concepts disclosed herein and whether or not it mitigates any or all of the same technical problems as the main inventive concepts. The applicants hereby give notice that patent claims may be formulated to such features and/or combinations of such features during prosecution of the present application or of any further application derived or claiming priority therefrom.

What is claimed is:

1. A two-terminal switch circuit for inclusion in series with a load across a voltage supply for periodically energizing the load from the voltage supply, the circuit comprising; a controllable switch connected between terminals of the two-terminal switch circuit, a resistor and a capacitor connected in series in that order between a given one of said terminals and the other one of said terminals, and a voltage threshold responsive arrangement having an output signal/input signal characteristic which exhibits hysteresis, said voltage threshold responsive arrangement coupling a common point of the resistor and the capacitor to a control input of the controllable switch for closing the controllable switch upon the voltage across the capacitor increasing to above a first threshold value and opening the controllable switch upon the voltage across the capacitor subsequently decreasing to below a second threshold value which is lower than the first threshold value, said voltage threshold responsive arrangement having a power supply input for receiving an energizing voltage relative to said other one of said terminals, characterized in that said power supply input is connected to said common point.

2. A switch circuit as claimed in claim 1, wherein the controllable switch is a transistor switch.

3. A switch circuit as claimed in claim 2, wherein the transistor switch is a MOSFET switch.

4. A switch circuit as claimed in claim 1, wherein the voltage threshold responsive arrangement comprises a resistive voltage divider connected across said capacitor and a thyristor structure having a control input connected to a tap on said resistive voltage divider and an output connected to the control input of the controllable switch.

5. A switch circuit as claimed in claim 1, wherein the voltage threshold responsive arrangement comprises first and second resistive voltage dividers connected across said capacitor, and a set-reset flip-flop having a power supply input connected to the common point of the resistor and the capacitor, a set input connected to a tap on the first voltage divider, a reset input connected to a tap on the second voltage divider and an output connected to the control input of the controllable switch.

6. A switch circuit as claimed in claim 1, wherein the voltage threshold responsive arrangement comprises an operational amplifier having a power supply input connected to the common point of the resistor and the capacitor, a non-inverting input connected to the common point of the resistor and the capacitor via a first resistance, an inverting input connected to a reference voltage source, an output connected to the control input of the controllable switch, and a second resistance connecting the output of the operational amplifier to the non-inverting input of the operational amplifier.

7. A switch circuit as claimed in claim 1 further comprising a discharge path for the capacitor which at least partly includes the controllable switch.

8. A switch circuit as claimed in claim 1 wherein said resistor is a part of a discharge path for the capacitor.

9. A switch circuit as claimed in claim 1 wherein the discharge time constant of the capacitor is at least partly determined by the resistance of said resistor.

10. A switch circuit as claimed in claim 1 wherein the charging time constant of the capacitor is mainly determined by the resistance of the resistor.

11. A switch circuit as claimed in claim 1 wherein, when the controllable switch is closed, the resistor and the controllable switch form a series circuit discharge path for the capacitor.

12. A switch circuit as claimed in claim 1 wherein the voltage threshold responsive arrangement comprises a thyristor-type circuit which, under normal operating conditions of the switch circuit and load, switches the controllable switch on and off at a frequency dependent upon the terminal voltage of the voltage supply.

13. A switch circuit as claimed in claim 1 wherein the voltage threshold responsive arrangement further comprises a signal input terminal coupled to said common point so as to be responsive to the capacitor voltage thereby to control the switching frequency of the controllable switch.

14. A switch circuit as claimed in claim 1 wherein the voltage threshold responsive arrangement further comprises:

a first resistive voltage divider connected across said capacitor, a second resistive voltage divider connected across the capacitor, a bistable circuit having first and second control inputs, wherein the first control input is connected to a tap on said first resistive voltage divider and the second control input is coupled to a tap on the second resistive voltage divider, and an output connected to the control input of the controllable switch.

15. A road vehicle direction indicator lamp circuit including a two-terminal switch circuit as claimed in claim 1 connected in series with a load across a battery included in the vehicle, the load having first and second terminals and comprising a pair of left indicator lamps, a pair of right indicator lamps and a direction indicator switch which is actuable into first, second and third states in which it connects the pair of left indicator lamps between the first and second terminals of the load, the pair of right indicator lamps between the first and second terminals of the load, and is open circuit, respectively.

* * * * *